United States Patent
Dutra

(10) Patent No.: US 7,877,937 B2
(45) Date of Patent: Feb. 1, 2011

(54) HIGH-STIFFNESS, LIGHTWEIGHT BEAM STRUCTURE

(75) Inventor: David Dutra, Long Beach, CA (US)

(73) Assignee: Amonix, Inc., Seal Beach, CA (US)

( * ) Notice: Subject to any disclaimer, the term of this patent is extended or adjusted under 35 U.S.C. 154(b) by 28 days.

(21) Appl. No.: 12/202,683

(22) Filed: Sep. 2, 2008

(65) Prior Publication Data

US 2010/0050569 A1 Mar. 4, 2010

(51) Int. Cl.
*E04D 13/18* (2006.01)
(52) U.S. Cl. .................. 52/173.3; 52/698; 52/701; 52/715; 52/845
(58) Field of Classification Search .......... 52/698, 52/701, 715, 845, 173.3; 29/897.35
See application file for complete search history.

(56) References Cited

U.S. PATENT DOCUMENTS

| | | |
|---|---|---|
| 4,106,952 A | 8/1978 | Kravitz |
| 4,380,013 A | 4/1983 | Slysh |
| 4,729,201 A | 3/1988 | Laurus et al. |
| 5,457,927 A | 10/1995 | Pellock et al. |
| 5,499,480 A | 3/1996 | Bass |
| 5,553,437 A | 9/1996 | Navon |
| 5,771,653 A | 6/1998 | Dolati et al. |
| 6,170,217 B1 | 1/2001 | Meyer |
| 6,559,371 B2 | 5/2003 | Shingleton et al. |
| 6,964,140 B2 | 11/2005 | Walker et al. |

OTHER PUBLICATIONS

ISA/US, "PCT Search Report," Oct. 13, 2009, p. 1-2.

*Primary Examiner*—Richard E Chilcot, Jr.
*Assistant Examiner*—Mark R Wendell
(74) *Attorney, Agent, or Firm*—John K. Fitzgerald; Fulwider Patton LLP

(57) ABSTRACT

A lightweight, high-stiffness structural beam having a web and a chord, which features a cross-sectional geometry featuring a plurality of sides arranged in an asymmetrical, non-closed, convex polygon shape. At least three of the sides of the chord are substantially parallel to one another, and are substantially perpendicular to the web. The beam is easily manufactured using fully-automated fabrication machinery and may serve as the main, flexure-resistant structural component of a sunlight-concentrating photovoltaic module.

17 Claims, 5 Drawing Sheets

HIGH-STIFFNESS, LIGHTWEIGHT BEAM STRUCTURE

BACKGROUND

1. Field of the Invention

The field of the invention generally relates to a high-stiffness, lightweight beam for use in manufacturing structures. More particularly, the invention relates to longitudinal structural elements for incorporation into photovoltaic panel assemblies.

2. General Background and State of the Art

Solar electric panels convert sunlight energy into electrical energy. As such, they can potentially compete with conventional methods of electricity generation, such as, for example, steam turbine generators fueled by coal, nuclear fuel, or natural gas.

In order for solar energy to compete on a large scale with conventional electricity generation, the cost of solar energy systems must be significantly reduced. Commercially-prevalent solar panels are manufactured almost entirely by automation, and their labor cost component has therefore already been minimized. The real cost-drivers of commercially-prevalent solar panels are the costs of the equipment, facilities, and energy for purifying and "growing" the monocrystalline silicon that constitutes the solar cells themselves. The solar energy industry is currently pursuing radical cost reduction by designing systems that minimize the use of the expensive purified silicon material.

One approach to minimizing silicon material use is to design the solar energy system using small solar cells spaced apart on a substrate, and using inexpensive converging lenses to focus large areas of sunlight onto those solar cells. This approach reduces the use of silicon, per kilowatt of power generating capacity, by a factor that approximates the optical concentration ratio of the lenses. In some cases the amount of silicon required may be reduced to $1/200^{th}$ or less than that required by conventional flat plate solar panels. The configuration of such a lens-based concentrating photovoltaic system tends to resemble a "sandwich" of uniform thickness, with the lenses mounted on the top side of the sandwich, the solar cells spaced on substrates mounted on the bottom side of the sandwich, and the sunlight converging path traversing the empty space between the two. In order to keep the focused sunbeams centered onto the solar cells as the earth rotates below the sun, causing the sun to appear as though it is moving across the sky, the entire solar module structure must accurately track the sun, and the solar module structure must be significantly rigid such that its flexural "sag" does not significantly degrade the relative alignments of the lenses and solar cells.

What has been needed is a beam member used to form a structure for a pedestal-mounted solar panel system that is cost efficient, increases the ratio of flexural stiffness to material volume of the beam, includes a shape and size that facilitates attachment of components to the system, and has the ability to be fabricated from pre-galvanized or pre-coated sheet metal.

SUMMARY OF THE INVENTION

In one aspect of the invention a structural beam includes a planar sheet of material or web with a desired length having a first or top edge and a second or bottom edge. The top and bottom edges extend between a proximal end and a distal end of the planar sheet of material. There is at least a first chord or flange connected generally perpendicular to the planar sheet along the top edge, the chord having a cross-section with five sides. There may also be a second chord or flange connected generally perpendicular to the planar sheet along the second edge, the second chord having a cross-section with five sides.

In one aspect, the cross-sectional shape of the chords has at least five sides arranged in an asymmetrical, non-closed polygon shape. The chords each include three sides that are generally parallel to one another and generally perpendicular to the planar sheet of material. There are also two opposing sides of the chords with planes that are generally parallel to each other and with the planar sheet of material. Also, the cross-section of each chord includes four sides generally oriented in the shape of a quadrilateral, for example, a rectangle or a square.

In another aspect, the structural beam is fabricated from one continuous piece of material, such as sheet metal. Further, the structural beam may be manufactured with a conventional roll-forming or brake-forming fabrication process.

In a further aspect, structural beams may be used to serve as the main longitudinal beam members of a mechanical structure for a solar panel system, such as a pedestal-mounted solar panel system. The frame of the mechanical structure is formed of structural beams, with each structural beam including a planar sheet of material or web with a desired length having a top edge and a bottom edge. A first chord or flange is connected generally perpendicular to the planar sheet along the top edge, and a second chord or flange is connected generally perpendicular to the planar sheet along the bottom edge. The first and second chords each having a cross-section with five sides. The solar panel system also includes a plurality of converging lenses that are affixed to the first chord on the top edge of the structural beam. A plurality of solar cells are spaced apart and attached to a substrate with the substrate affixed to the second chord on the bottom edge of the structural beam. The converging lenses and solar cells are positioned relative to one another in the solar panel system so that the lenses focus light (sunlight) onto the individual solar cells attached to the substrate. The frame formed using the structural beams has a rigidity such that its flexural "sag" does not degrade the relative alignments of the converging lenses and solar cells.

DETAILED DESCRIPTION OF THE INVENTION

Figure 1:
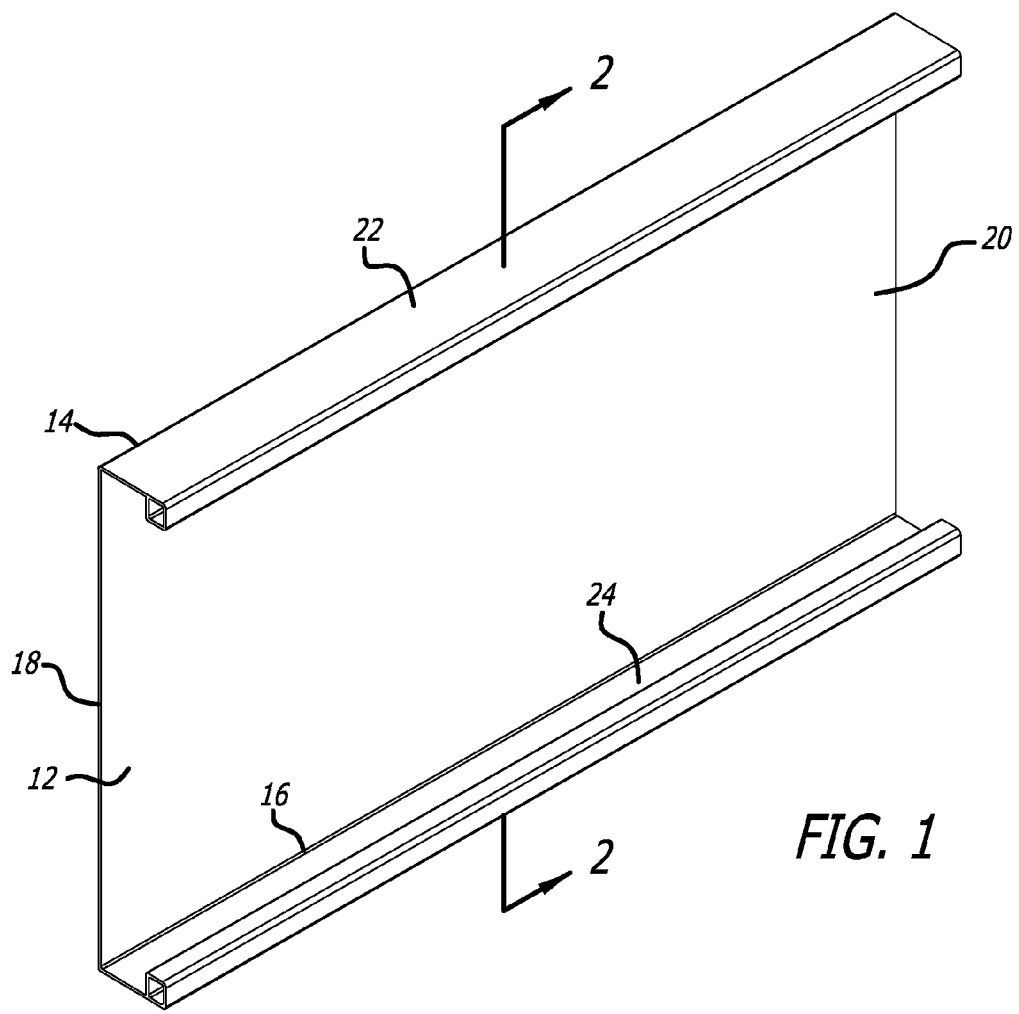
FIG. 1 is a perspective view of a flexure-resistant beam.
Figure 2:
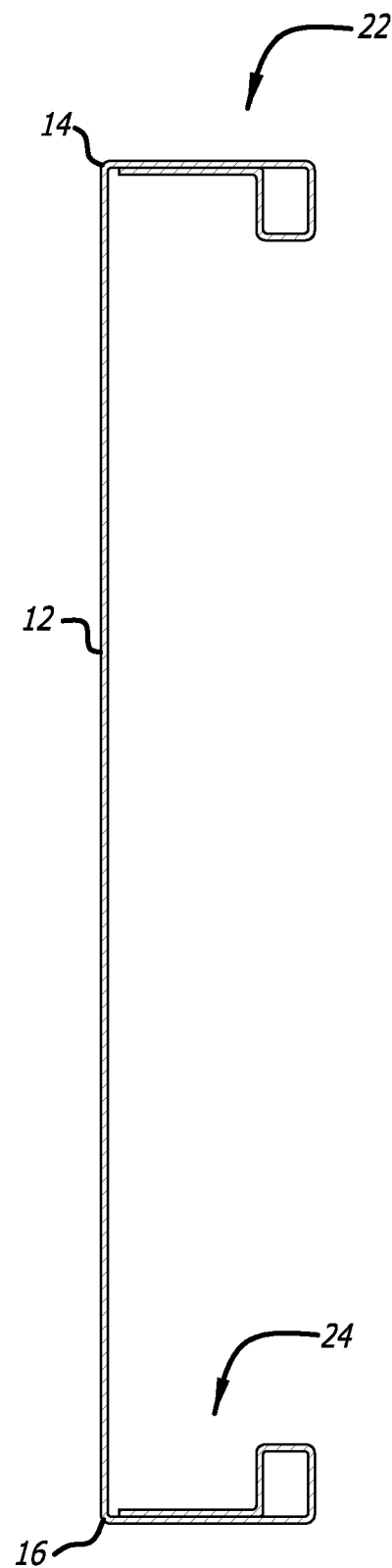
FIG. 2 is a cross-sectional view taken along line 2-2 of FIG. 1.

As shown in FIGS. 1 through 3, a structural beam 10 includes a planar sheet of material or web 12 with a desired length having a first or top edge 14 and a second or bottom edge 16. The top and bottom edges extend between a proximal or first end 18 and a distal or second end 20 of the planar sheet of material. There is a first chord or flange 22 connected generally perpendicular to the planar sheet along the top edge, the chord having a cross-sectional shape with five sides. There may also be a second chord or flange 24 connected generally perpendicular to the planar sheet along the second edge, the second chord having a cross-sectional shape with five sides. In this embodiment, the chords are integral with the web, however, in other embodiments the chords may formed of a separate material that is attached to the web. It is also shown that both the first and the second chord extend away from the web in the same direction, but depending on the use of the beam, the chords may extend in opposite directions.

Figure 3A:
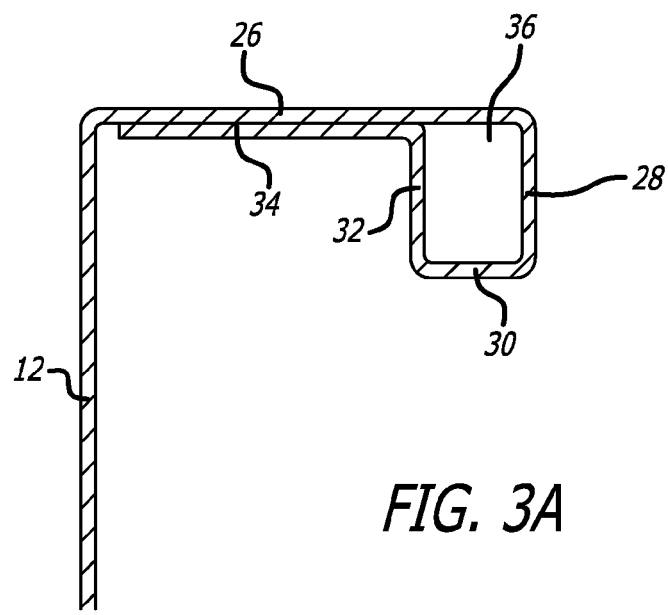
FIG. 3A is a detailed cross-sectional view of one embodiment of a chord of the flexure-resistant beam shown in FIG. 1.

In a preferred embodiment, the shape of the chords 22 and 24 has at least five sides arranged in an asymmetrical, non-closed polygon shape. As best shown in FIG. 3A, the chords include an outer-facing side 26, an adjacent right-facing side 28, a further adjacent bottom-facing side 30, a further adjacent left-facing side 32, and another bottom-facing side 34 extending towards the web 12 that is disposed adjacent to and parallel with outer-facing side 26. As shown, sides 26 and 34 may have close planar contact with one another. It is preferred that the chord sides 26, 28, 30, 32, 34 are integral with the web 12, however, each side may be mechanically joined to each other and the web. Sides 26, 30, and 34 of the chord each have planes that are generally parallel to one another and generally perpendicular to the plane of the web. Chord sides 28 and 32 oppose one another and have planes that are generally parallel to each other and with the plane of the web. In one embodiment, for example, the distance between sides 28 and 32 is preferably about 0.75 inches, but may be between about 0.125 inches and 6 feet. Also, the distance between sides 26 and 30 is about 0.75 inches, but may be between about 0.125 inches and 6 feet. In a preferred embodiment, the cross-section of the chord includes four sides 26, 28, 30, and 32 generally oriented in the shape of a quadrilateral. In this instance the quadrilateral is rectangular shaped, but may be shaped like a square or any other quadrilateral. The quadrilateral defines a cavity 36, which may be fully or partially enclosed.

Figure 3B:
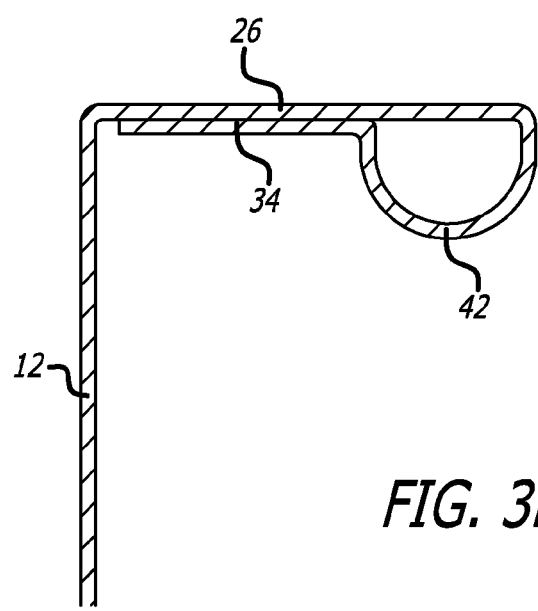
FIG. 3B is a detailed cross-sectional view of another embodiment of a chord of a flexure-resistant beam.

In another embodiment, such as the embodiment depicted in FIG. 3B, the chord 22 may have a cross-sectional shape including a partial-circle or similar curve. In this embodiment, the chord includes outer-facing side 26, curve 42, and bottom-facing side 34. The curve 42 gives the chord a P-shaped cross-section. It has also been contemplated that other embodiments could include a chord having a number of sides equal to two, three, four, five, six, seven, or more without departing from the scope of the invention.

In one embodiment, the shape of the cross-section of the flexure-resistant beam 10 is chosen to facilitate the attachment of the adjacent components of the final structure. Such adjacent components may include panels of converging lenses and substrates including spaced apart solar cells as discussed more below. The range of material thickness of the beam 10 is chosen such that conventional self-tapping screws may be easily driven into the beam. In one embodiment the thickness of the material used to form the web and chords is between about 0.02 inches and 0.25 inches, and is preferably about 0.06 inches. The sides of the beam including the chord are substantially planar to facilitate the interface and attachment of adjacent components.

Figure 4A:
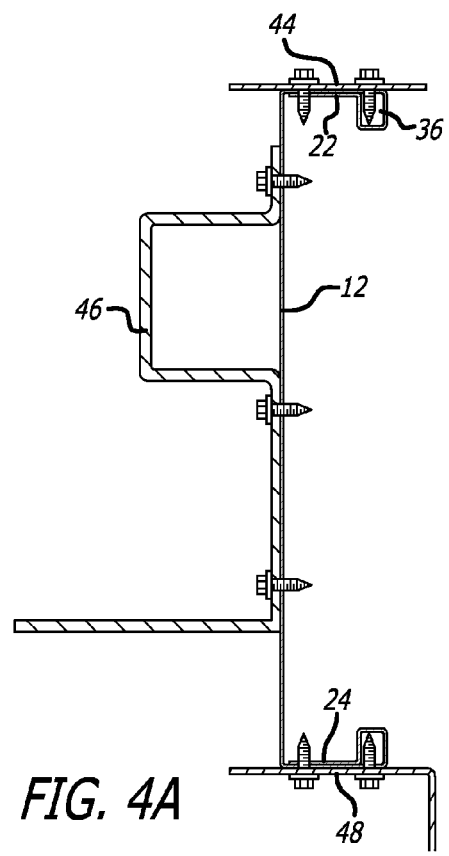
FIGS. 4A and 4B are cross-sectional views of the flexure-resistant beam of FIG. 1, with representative adjacent components fastened to the beam.
Figure 4B:
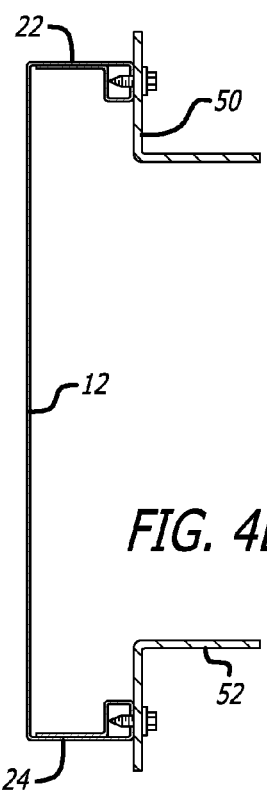

As shown in FIGS. 4A and 4B, the beam cross-section of the preferred embodiment presents mounting surfaces facing several different directions, such that adjacent components 44, 46, 48, 50, and 52 can be mounted on any side and on any portion of the beam depending on its use. The cavity 36 of beam 10 is designed to accommodate the protruding length of fasteners driven through the faces of the beam. As seen in FIG. 4A, component 46 is mounted to the web 12 of the beam with a plurality of fasteners, and components 44 and 48 are each mounted to chords 22 and 24, respectively. The tip and length of one fastener connecting components 44 and 48 to the chords is shown to be located within the cavity 36 of the beam. FIG. 4B shows components 50 and 52 mounted to chords 22 and 24, respectively, with the fastener placed through side 28 of the chords, such that the tip and length of the fasteners are located within the cavity 36 of the beam.

Figure 5:
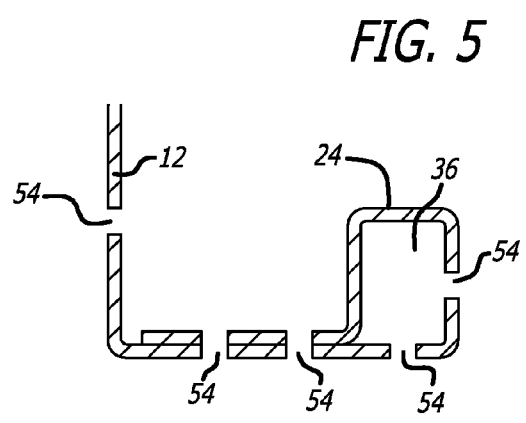
FIG. 5 is a detailed cross-sectional view of one embodiment of a chord of a flexure-resistant beam having pre-punched holes.

The driving of fasteners through the double material thickness of chord sides 26 and 34 may be facilitated by pre-forming a hole 54 through one or both of these sides. As shown in FIG. 5, holes 54 may be pre-formed on any side or portion of the beam 10 to allow easy attachment of fasteners, such as screws, bolts, rivets, pegs, ties, and the like.

In a preferred embodiment, the geometry of the flexure-resistant beam 10, including the non-closed cross-section of the chords 22 and 24, is designed to be manufacturable from a single, continuous sheet of material, such as sheet metal. It is also preferred that the continuous sheet of material includes a substantially uniform material thickness, such that it is possible to fabricate the invention from inexpensive pre-galvanized or pre-coated sheet material, using a fabrication method that does not substantially disturb the mechanical, corrosion-resistant, or cosmetic properties of the pre-galvanized or pre-coated material. Examples of such fabrication methods include roll-forming or brake-forming.

In other embodiments, the beam 10 could be formed by extrusion, pultrusion, composite layup, hot rolling, thermal bending, or other method. The beam could also be fabricated from more than one piece of material. For example, the chords 22 and 24 could be formed using separate sheets of material, and the chords would be joined at the top and bottom edges 14 and 16 by welding or other mechanical means.

It is preferred that the material used to form the beam 10 includes commercial-grade sheet metal. Other metals that may be used to form the beam include, without limitation, steel, aluminum, or other materials that provide the desired characteristics of stiffness, strength and manufacturability. Also, other constituent materials for the beam might include plastics, composites, or combinations of materials.

The dimensions of the cross-section of the flexure-resistant beam 10 are chosen to produce a structure with high ratios of stiffness-to-material volume and stiffness-to-weight. In one embodiment, the area moment of inertia-to-material volume ratio is at least 35 inch$^4$ per cross-sectional square inch, the flexural stiffness-to-weight ratio is at least $3.7 \times 10^9$ lb*inch$^2$ per (lb per inch of beam length), and the strength-to-weight ratio depends on the specific type of mechanical load being resisted. A high flexural stiffness is obtained in the embodiments of the present invention by incorporating a cross-sectional shape with a large area moment of inertia about the neutral axis of bending. This embodiment also provides a low material volume for the purposes of weight and cost minimization. Increasing the flexural stiffness and decreasing the material volume of the beam 10 are accomplished by increasing the volume of the material that constitutes the top and bottom chords 22 and 24 of the beam 10, and decreasing the volume of the material that constitutes the web 12 of the beam. Since the preferred embodiment is fabricated from a substantially uniform-thickness sheet of material, the volume of the material constituting the chords is increased by designing the top and bottom chords with multiple folded thicknesses of material, and by designing the web with a single thickness of material, as best shown in the FIG. 2. Having a high stiffness-to-weight ratio is also accomplished by increasing the distance, constrained by the overall dimensions of the final structure, between the top and bottom chords of the beam.

Figure 6:
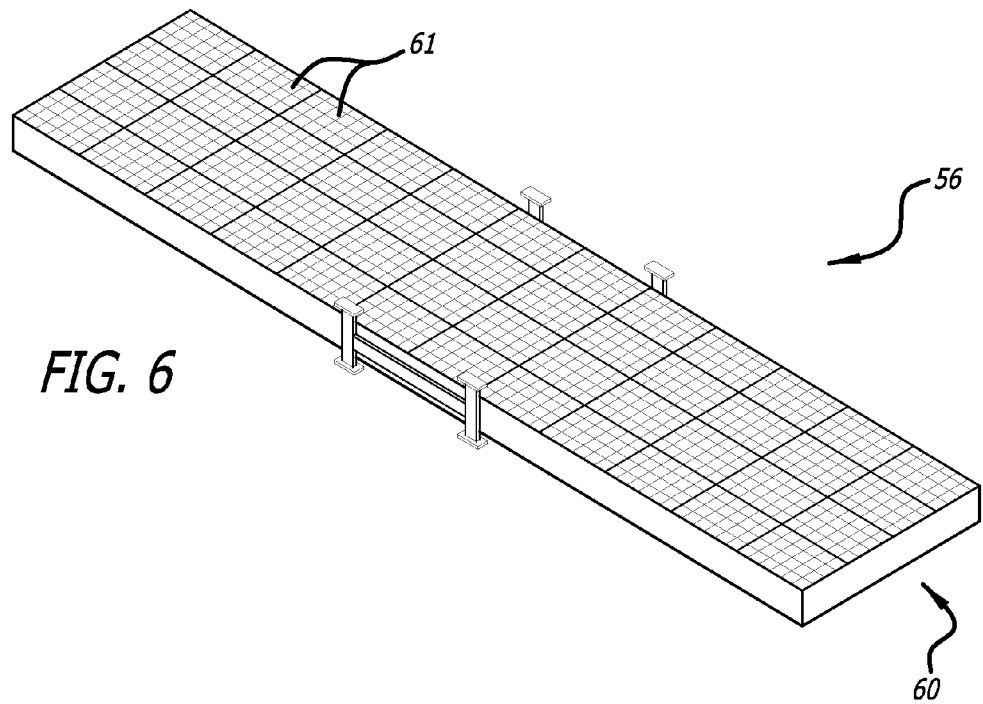
FIG. 6 is a perspective view of a pedestal-mounted solar panel system.
Figure 7:
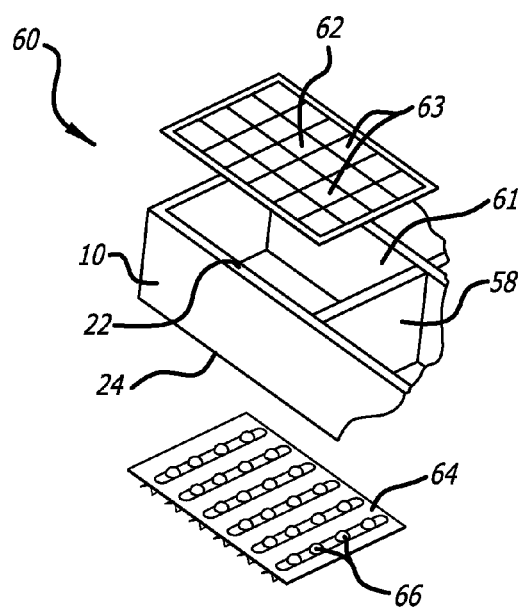
FIG. 7 is an exploded view of a corner section of the pedestal-mounted solar panel system of FIG. 6.

Although the beam 10 may be used to form any part of any mechanical structure, in one embodiment, multiple beams 10 may serve as the main longitudinal beam members of a mechanical structure for a pedestal-mounted solar panel system 56 as shown in FIGS. 6 and 7. Use of such a beam as provided by the various embodiments of the present invention reduces the cost of the pedestal-mounted solar panel system. The beam provides these advantages by increasing the ratio of flexural stiffness to material volume, and decreasing material usage in those regions of the beam, such as the web 12, that contribute least to the flexural stiffness of the structure and mechanical strength. Also, the pedestal-mounted solar panel system is more cost efficient because the beam may be manufactured by inexpensive, high speed, highly-automated fabrication technologies, and the beam is able to be fabricated from pre-galvanized or pre-coated sheet metal. These advantages are also realized by the beam having a shape and size that facilitates the attachment of the other components of the solar panel system.

One embodiment of the pedestal-mounted solar panel system 56 is shown in FIGS. 6 and 7 to include a structural frame 60 with individual sub-frames 61 that are generally rectangular in shape; however, the structural frame may be any other polygonal shape including a square. The frame 60 and sub-frames 61 are formed by multiple beams 10 used as the main longitudinal beam members with cross-beams 58 used to connect the longitudinal beam members together and form the frame 60 for the system. In one embodiment, the cross-beams can also be the beams 10 of the present invention. There are forty-eight sub-frames in the embodiment shown in FIG. 6, all aligned in a pattern of twelve rows and four columns. But, in other embodiments, the pedestal mounted solar panel system may include, for example, but not limited to, as few as one sub-frame or as many as 400.

Typically, the overall structural frame 60 has a length of, for example, but not limited to, about 40 feet to about 60 feet, and a width of, for example, but not limited to, about 6 feet to about 12 feet. Each sub-frame 61 may have a length of, for example, but not limited to, 2 feet to about 6 feet and a width of, for example, but not limited to, about 2 feet to about 6 feet, and preferably is about 4 feet long by 3 feet wide. Also, the height of the beams 10 (the distance from the top edge 14 to the bottom edge 16) may be, for example but not limited to, between about 6 inches and about 3 feet, and is preferably about 2 feet. Also, the width of the first and second chords 22 and 24, which is the length of chord side 26, may range from, for example, but not limited to, about 1 inch to about 6 inches, and is preferably about 3 inches.

Still referring to FIGS. 6 and 7, panels of converging lenses 62, such as a Fresnel lens panel, each have an optical lens pattern 63 and are secured to the top chords 22 of the beams. A substrate 64 including a plurality of solar cells 66 spaced apart on the substrate is mounted to the bottom chords 24 of the beams, such that individual converging lenses are aligned with individual solar cells. In this embodiment, there are twenty-four optical lens patterns 63 disposed on the panel in a pattern having six rows and four columns, which matches the pattern of solar cells 66 on the substrate 64. In use, the converging lens patterns focus sunlight onto individual solar cells attached to the substrate. The frame, including beams 10, has a rigidity such that its flexural "sag" does not degrade the relative alignments of the converging lenses and solar cells over time.

Although the present invention has been described in the context of a preferred embodiment, it is not intended to limit the invention to the embodiment described. Accordingly, modifications may be made to the disclosed embodiment without departing from the spirit and scope of the invention. It is also contemplated that various combinations or subcombinations of the specific features and aspects of the embodiments can be combined with or substituted for one another in order to form varying modes of the invention. Accordingly, the invention is intended to be defined only by the claims that follow.

I claim:

1. A structural beam for use in constructing a solar power module fabricated from a single piece of material, comprising:
    a planar sheet with a length having a first edge and a second edge;
    a first chord disposed generally perpendicular to the planar sheet along the first edge, the chord having a cross-section with five sides, two of which sides are parallel to each other and to the planar sheet and three of which sides are parallel to each other, and are generally perpendicular to the planar sheet;
    a second chord disposed generally perpendicular to the planar sheet along the second edge, the second chord extending from the planar sheet in the same direction as the first chord, the second chord having a cross-section with five sides, two of which sides are parallel to each other and to the planar sheet and three of which sides are parallel to each other, and are generally perpendicular to the planar sheet; and
    wherein a first side of the first chord and a first side of the second chord define a space therebetween in which the remaining four sides of the first chord and the remaining five sides of the second chord are disposed.

2. The structural beam of claim 1, wherein the first chord includes two opposing sides that are spaced apart approximately equal to or less than 0.25 inch.

3. The structural beam of claim 1, wherein the cross-section of the first chord includes four sides generally oriented in the shape of a quadrilateral.

4. The structural beam of claim 1, wherein the thickness of the material used to form the planar sheet and the first chord is suitable for tapping with conventional self-tapping screws.

5. The structural beam of claim 1, wherein the ratio of flexural stiffness to material weight is at least $3.7 \times 10^9$ pound*inch$^2$ per (pound per inch of beam width).

6. A solar panel system, comprising:
    a frame including structural beams, each structural beam having a planar sheet with a length, a top edge, and a bottom edge, a first chord connected generally perpendicular to the planar sheet along the top edge, and a second chord connected generally perpendicular to the planar sheet along the bottom edge, the first and second chords each having a cross-section with five sides, two of which sides are parallel to each other and to the planar sheet and three of which sides are parallel to each other, and are generally perpendicular to the planar sheet, wherein a first side of the first chord and a first side of the second chord define a space therebetween in which the remaining four sides of the first chord and the remaining five sides of the second chord are disposed;
    a plurality of converging lenses affixed to the first chord of the structural beam of the frame; and
    a plurality of solar cells attached to a substrate, the substrate affixed to the second chord of the structural beam of the frame;

wherein the converging lenses focus light onto individual solar cells attached to the substrate, and the frame has a rigidness such that its flexural sag does not degrade the relative alignments of the converging lenses and solar cells.

7. The system of claim 6, wherein the ratio of flexural stiffness to material weight is at least $1.3 \times 10^6$ pound*inch$^2$ per pound of total solar panel weight.

8. The system of claim 6, wherein the structural beam is fabricated from one piece of material.

9. The system of claim 6, wherein the cross-section of the first and second chords each includes four sides generally oriented in the shape of a quadrilateral.

10. A method of manufacturing a structural beam, comprising:
    forming a first chord along a top edge of a single sheet of material having a planar surface by bending the top edge, such that the cross-section of the first chord includes five sides, with three sides of the first chord being perpendicular to the planar surface of the single sheet of material and with two of the sides being parallel to each other and to the planar sheet, the first chord having a first side that defines a space adjacent to an inner surface of the planar surface in which the remaining four sides are formed; and
    forming a second chord along a bottom edge of the single sheet of material by bending the bottom edge, such that the cross-section of the second chord includes five sides, with three sides of the second chord being perpendicular to the planar surface of the single sheet of material and with two sides being parallel to each other and to the planar sheet, the second chord having a first side that opposes the first side of the first chord and that further defines the space adjacent to the inner surface of the planar surface and in which the remaining four sides are formed.

11. The method of claim 10, wherein forming the first and second chords using roll-forming.

12. The method of claim 10, wherein forming the first and second chords using brake-forming.

13. The method of claim 10, wherein the single sheet of material is pre-galvanized sheet metal.

14. The method of claim 10, wherein forming the first and second chords, the cross-section of the first and second chords each includes four sides generally oriented in the shape of a quadrilateral.

15. The method of claim 14, wherein forming the first and second chords, the cross-section of the first and second chords includes two opposing sides that are spaced apart approximately equal to or less than 0.25 inch.

16. The method of claim 10, further comprising pre-punching a hole through the first chord to facilitate driving fasteners through the first chord.

17. A structural beam for use in solar cell array, comprising:
    a planar sheet with a length having a first edge and a second edge; and
    a first chord disposed generally perpendicular to the planar sheet along the first edge, the chord having a P-shaped cross-section, the first chord including an outer-facing side, an inward-facing side parallel to the outer-facing side, and a curved section disposed in between the outer-facing side and the inward-facing side;
    a second chord disposed generally perpendicular to the planar sheet along the second edge, the chord having a P-shaped cross-section, the second chord including an outer-facing side, an inward-facing side parallel to the outer-facing side, and a curved section disposed in between the outer-facing side and the inward-facing side; and
    wherein the curved sections of the first and second chord face each other and are disposed between the inward-facing side of the first chord and the inward-facing side of the second chord.

* * * * *